US006821407B1

(12) United States Patent
Reid et al.

(10) Patent No.: US 6,821,407 B1
(45) Date of Patent: Nov. 23, 2004

(54) ANODE AND ANODE CHAMBER FOR COPPER ELECTROPLATING

(75) Inventors: Jonathan D. Reid, Sherwood, OR (US); Timothy Mark Archer, Lake Oswego, OR (US); Thomas Tan Vu, San Jose, CA (US); Seshasayee Varadarajan, Wilsonville, OR (US); Jon Henri, West Linn, OR (US); Steven T. Mayer, Lake Oswego, OR (US); David Sauer, Tigard, OR (US); Anita Kang, Portland, OR (US); Gerald Feldewerth, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 227 days.

(21) Appl. No.: 10/231,147

(22) Filed: Aug. 27, 2002

Related U.S. Application Data

(63) Continuation-in-part of application No. 09/706,272, filed on Nov. 3, 2000, now Pat. No. 6,527,920.

(60) Provisional application No. 60/203,432, filed on May 10, 2000.

(51) Int. Cl.[7] ............................ C25D 3/38; C25D 17/00

(52) U.S. Cl. ....................... 205/292; 204/252; 204/282; 204/237; 204/238

(58) Field of Search ................................ 205/291–298; 204/252, 282, 237, 238

(56) References Cited

U.S. PATENT DOCUMENTS 3,652,422 A 3/1972 Powers et al.
3,862,891 A 1/1975 Smith
4,033,833 A 7/1977 Bestel et al.
4,240,886 A 12/1980 Hodges et al.
4,272,335 A 6/1981 Combs
4,304,641 A 12/1981 Grandia et al.
4,469,564 A 9/1984 Okinaka et al.
4,545,877 A 10/1985 Hillis
4,605,482 A 8/1986 Shirgami et al.
4,696,729 A * 9/1987 Santini .................. 204/224 R
4,828,654 A * 5/1989 Reed .......................... 205/97
4,906,346 A 3/1990 Hadersbeck et al.
4,931,149 A 6/1990 Stierman et al.
4,933,061 A 6/1990 Kulkarni et al.
5,039,381 A 8/1991 Mullarkey
5,096,550 A 3/1992 Mayer et al.
5,162,079 A 11/1992 Brown
5,368,711 A 11/1994 Poris
5,391,285 A 2/1995 Lytle et al.
5,421,987 A 6/1995 Tzanavaras et al.
5,443,707 A 8/1995 Mori
5,472,592 A 12/1995 Lowery
5,476,578 A 12/1995 Forand
5,498,325 A 3/1996 Nishimura et al.
5,516,412 A 5/1996 Andricacos et al.
5,567,300 A 10/1996 Datta et al.
5,935,402 A * 8/1999 Fanti .......................... 205/101
6,126,798 A 10/2000 Reid et al.
6,251,255 B1 6/2001 Copping et al.
6,368,475 B1 4/2002 Hanson et al.
6,391,188 B1 5/2002 Goosey
2003/0029527 A1 * 2/2003 Yajima et al. ............. 148/432

* cited by examiner

*Primary Examiner*—Donald R. Valentine
(74) *Attorney, Agent, or Firm*—Beyer Weaver & Thomas, LLP

(57) ABSTRACT

An electroplating system includes (a) a phosphorized anode having an average grain size of at least about 50 micrometers and (b) plating apparatus that separates the anode from the cathode and prevents most particles generated at the anode from passing to the cathode. The separation may be accomplished by interposing a microporous chemical transport barrier between the anode and cathode. The relatively few particles that are generated at the large grain phosphorized copper anode are prevented from passing into the cathode (wafer) chamber area and thereby causing a defect in the part.

25 Claims, 5 Drawing Sheets

ANODE AND ANODE CHAMBER FOR COPPER ELECTROPLATING

CROSS-REFERENCE TO RELATED APPLICATION

This application is a continuation in part of U.S. patent application Ser. No. 09/706,272, filed Nov. 3, 2000, now U.S. Pat. No. 6,527,920 by Steven T. Mayer, Evan E. Patton, Robert L. Jackson and Jonathan D. Reid, and titled "COPPER ELECTROPLATING METHOD AND APPARATUS", which claims priority from Provisional Application No. 60/203,432, having Steven T. Mayer et al. as inventors, filed May 10, 2000, and titled "METHODS, MATERIALS, AND APPARATUS FOR IMPROVED COPPER ELECTROPLATING. Both of these applications are incorporated herein by reference by all purposes.

BACKGROUND

This invention relates to apparatus and methods for electroplating metal layers onto substrates. More specifically, it relates to apparatus including anodes of a specified structure and membrane separators defining anode chambers.

Damascene processing is the principal method for forming copper metal lines on integrated circuits. In a typical Damascene process, copper lines together with blind vias (which comprise Damascene or dual Damascene interconnections) are created by the following sequence: (I) form trench pattern in dielectric on wafer face using etch resistant photoresist, (2) etch features (trenches), (3) remove resist, (4) form via pattern in dielectric on wafer face using etch resistant photoresist, (5) etch vias, (6) remove resist, (7) deposit PVD Tantalum barrier and copper seed, (8) electroplate copper to fill etched features, and (9) polish copper off the wafer face leaving copper filled interconnect circuitry.

Since an integrated circuit is composed of large numbers of very small features (having dimensions approaching 0.1 micrometers), it is extremely important to produce these features using a process that generates very few defects in the features. While defects can arise at any step in the process flow, one area that requires special attention is operation 8 above (electroplating). During electroplating, any condition that alters the local deposition characteristics can give rise to a defect in the final line structure. Some defects are manifest as protrusions or irregular growths of copper, and others as pits or regions of reduced local growth. In many cases, the defect or irregularity remains after the final CMP process.

One source of abnormal growth is the arrival and adherence of particulate material on the wafer surface. In some cases, a particle may arrive at the wafer surface and act to inhibit further copper growth by blocking the sites at which copper reduction will normally take place. This will result in pit formation. In another case, a particle may arrive at the wafer surface and provide an additional conductive surface on which copper growth can take place. This will result in a protruding defect, commonly called a "nodule" in electroplating parlance. In still another case, the particle may be coated with or composed of chemicals, which strongly alter the copper reduction process rate where they adsorb on the wafer. This can result in either a pit or a nodule depending on the nature of the chemicals in the particle reaching the wafer surface.

Electroplating baths are normally filtered to remove particles that could reach the wafer surface. Further, the baths are usually kept free, to the extent possible, of materials which could add particles to the plating solution. One material that typically cannot be avoided is a metal source anode. The metal source for most electroplating operations is an anode which dissolves to supply metal ions to the electroplating solution as ions are removed during plating. In copper electroplating, the dissolution of pure copper anodes can often result in the release of fine copper particles into the plating solution. Although these particles may eventually dissolve, they can cause the defects described above. A further problem with copper anodes arises from their propensity to decompose certain organic additives present in the copper electroplating baths. It has been found that phosphorus' can be added to the copper anode to mitigate both of these problems. When phosphorus is present, the anode forms an adherent thick black film as it dissolves. This film prevents dissolution of small copper particles into the bulk plating solution and reduces the decomposition of the additives in the plating bath.

The black film itself is, however, a poorly structured material and can be disrupted to form a dispersion of small particles. These particles can impact growth on the wafer surface as described above unless they are prevented from reaching the vicinity of the wafer. To reduce this problem, phosphorized copper anodes may be contained in polypropylene filter bags that prevent some particles from escaping into the bulk of the solution. Unfortunately, these filters bags typically do not prevent sub-micron particles from reaching the bulk plating solution except to the extent that they reduce electrolyte flow between the anode and the bulk of the plating bath. Restricted flow at the anode causes the copper ions generated at the anode to concentrate near the anode and eventually passivate the anode.

During typical use of a phosphorized anode the defect level on the wafer surface is initially very low regardless of the particular anode material or the flow characteristics. This correlates to plating before a film, which can become dislodged in solution has formed. As plating continues the film on the anodes begins to build up as a function of current flow and to dissolve at a rate dependent on its chemical stability. The film begins to dislodge and defects begin to from on the wafer surface at a level depending on the nature of the film and the flow into the anode chamber and between the anode chamber and the wafer surface.

What is needed therefore is improved electroplating technology that reduces particulate generation at the anode and/or constrains particles generated at the anode.

SUMMARY

The present invention addresses the above difficulties by improving anode film integrity and at the same time employing apparatus that separates the anode from the cathode and prevents most particles generated at the anode from passing to the cathode. The separation is preferably accomplished by interposing a microporous chemical transport barrier (sometimes referred to as a "membrane separator") between the anode and cathode. The transport barrier should limit the chemical transport (via diffusion and/or convection) of most species but allow migration of anion and cation species (and hence passage of current) during application of electric fields associated with electroplating. The anode film integrity is improved by providing a phosphorized copper anode having relatively large grain sizes. The relatively few particles that are generated at the phosphorized copper anode are prevented from passing into the cathode (wafer) chamber area and thereby causing defects in the part.

One aspect of this invention provides an apparatus for electroplating copper onto a substrate. The apparatus may be characterized by the following features: (a) a cathode electrical connection that can connect to the substrate and apply a potential allowing the substrate to become a cathode; (b) a copper anode having an average grain size of at least about 50 micrometers and comprising phosphorus in a concentration of at least about 200 ppm; and (c) a membrane separator (sometimes “transport barrier” herein) defining an anode chamber. The porous membrane separator enables migration of ionic species, including metal ions, across the transport barrier while substantially preventing particles larger than about 0.05 micrometers from passing. The ionic species are driven across the barrier by migration (movement in response to the imposed electric field) but the neutral particles do not transverse the transport barrier.

In some embodiments, the membrane separator can maintain different chemical compositions for the anolyte and the catholyte. Preferably it has an average pore size of at most about 0.1 micrometers (more preferably between about 0.06 and about 0.09 micrometers.

In certain embodiments, the copper anode has an average grain size of at least about 200 micrometer, more preferably between about 200 and about 1000 micrometers, and most preferably between about 500 and about 1000 micrometers. In some embodiments, the copper anode has a phosphorous content of at least about 400 ppm, more preferably between about 200 and about 1000 ppm, and most preferably between about 450 and about 600 ppm.

The apparatus may include a reservoir for electrolyte and a flow system, coupled to the reservoir, for circulating electrolyte through the anode chamber during electroplating. To further reduce defects, the flow system may include a filter for filtering particles from the electrolyte.

In a specific embodiment, the flow system can provide electrolyte flow through the anode chamber at a flow rate of between about 100 and 2000 milliliters per minute. Further, the apparatus may provide electrolyte flow between the anode and cathode chambers (through the membrane separator) at a rate of between 100 milliliters per minute and 1 liter per minute when the flow rate in the flow system is about 2000 milliliters per minute.

Another aspect of the invention provides a method of electroplating copper onto a substrate. The method may be characterized by the following sequence: (a) providing a copper anode in an anode chamber separated from a cathode chamber by a membrane separator; and (b) applying a potential difference between the substrate and the anode to allow the substrate to become a cathode and plate the copper onto the substrate. The membrane separator enables migration of ionic species, including ions of the metal, across the membrane while substantially preventing passage of particles larger than about 0.05 micrometers. As with the apparatus described above, the copper anode preferably has an average grain size of at least about 50 micrometers and comprises phosphorus in a concentration of at least about 200 ppm.

These and other features and advantages of the present invention will be described below with reference to the associated drawings.

DETAILED DESCRIPTION

Introduction

This invention employs anode chambers that effectively block passage of small particles, particularly particles generated at a copper anode, to work pieces that are being plated. The anode chambers accomplish this while allowing migration of ionic species between the chambers. In a preferred embodiment, a porous membrane acts as a chemical transport barrier that separates the anode and cathode. In preferred embodiments, the anode is composed of copper with grain sizes of at least about 50 micrometers on average and small amounts of phosphorous (e.g., at least about 200 ppm phosphorus).

The anode chamber construction may take many different forms. Generally, it should include a membrane separator (transport barrier) that prevents passage of small particles but allows ionic conduction or flow of the solute and solution molecules. One general anode chamber construction is described in U.S. Pat. No. 6,126,798, which is incorporated herein by reference for all purposes. Another general anode chamber construction is described in U.S. Patent Application No. U.S. patent application Ser. No. 09/706,272, filed Nov. 3, 2000, which was previously incorporated by reference.

Electrofill Apparatus and Operation

The apparatus of this invention may employ various different types of electroplating cells and flow systems. One example of a commercially successful copper electroplating apparatus is the SABRE™ electroplating apparatus available from Novellus Systems, Inc. of San Jose, Calif. and described in U.S. Patent Application U.S. Pat. No. 6,156,167 by Patton et al., issued Dec. 5, 2000, and in U.S. patent application Ser. No. 08/990,120 by Contolini et al., both incorporated by reference herein. Many features described in these patent documents can be employed in the present invention. One example is the “clamshell” design for engaging semiconductor wafers during electroplating.

Figure 1:
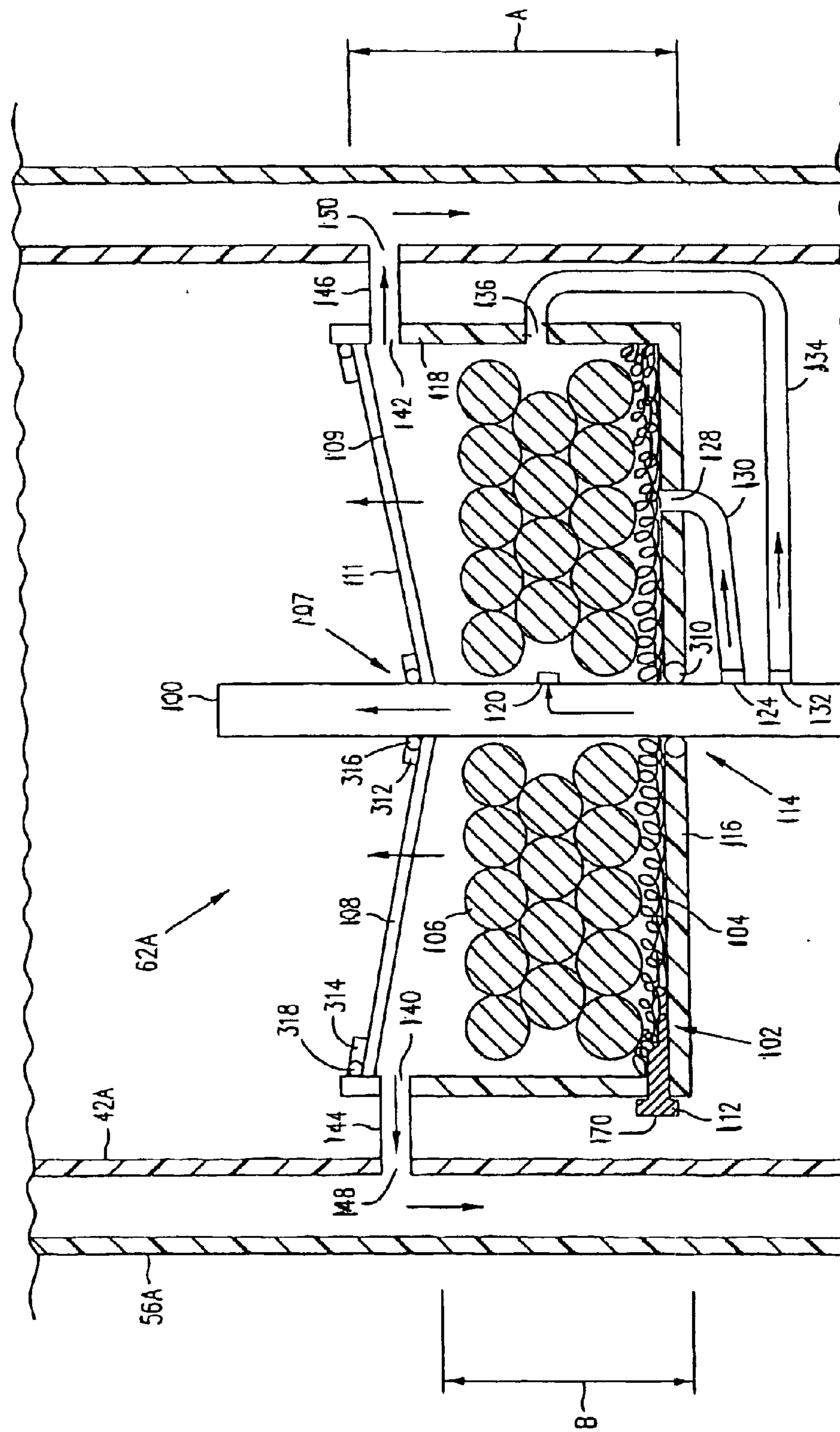
FIG. 1 is a cross-sectional view of an anode chamber suitable for use with the present invention.
Figure 2:
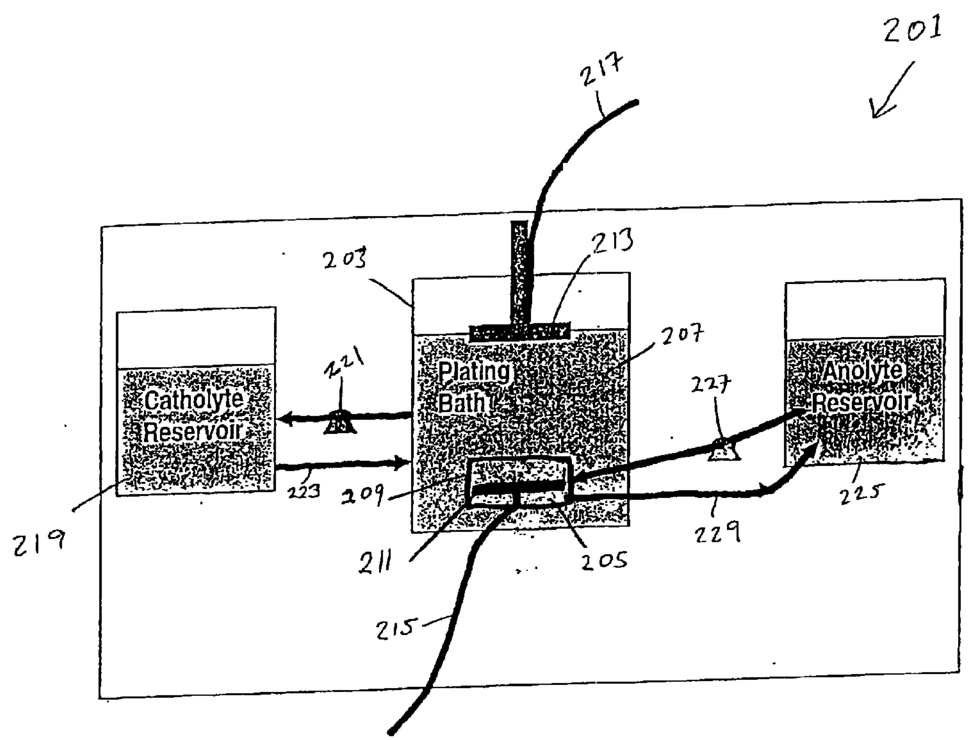
FIG. 2 is a block diagram of an electroplating system of this invention in which anolyte and catholyte are independently circulated between a plating region and reservoirs located outside the plating region.
Figure 3:
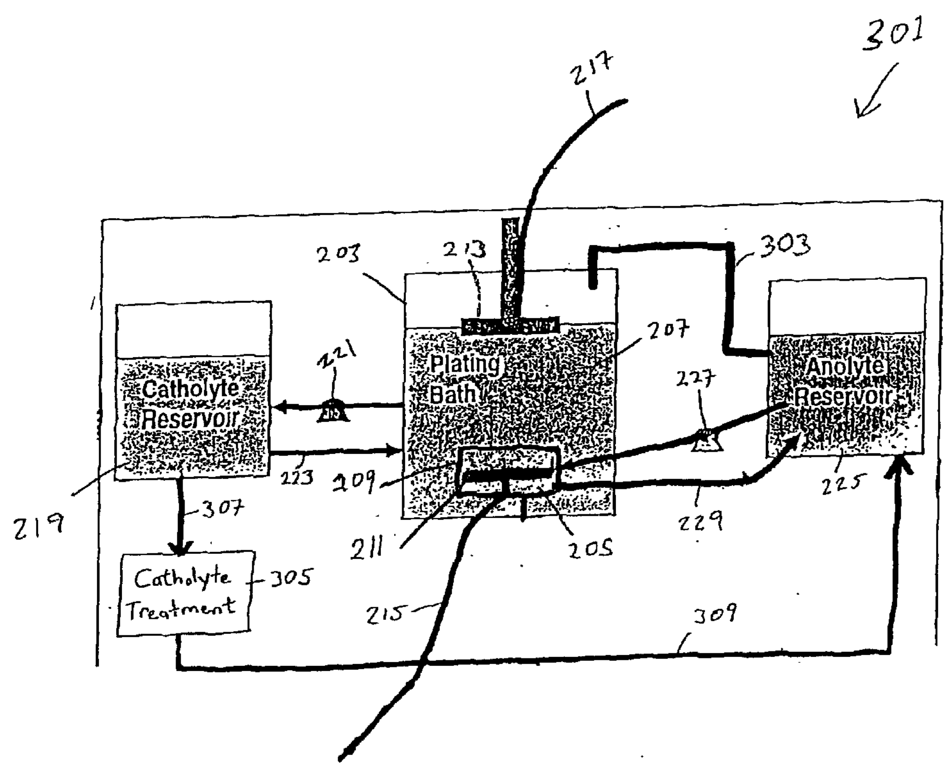
FIG. 3 is a block diagram of another electroplating system of this invention in which anolyte from the anode chamber is delivered to the cathode chamber via a flow conduit, and catholyte from cathode chamber is treated to remove additives and then provided to the anode chamber.

The apparatus of this invention may employ a single electrolyte reservoir or separate reservoirs for anolyte and catholyte. In FIG. 1, one example of an anode chamber design is depicted in detail. In FIGS. 2 and 3 diagrammatically depict systems having two separate reservoirs, one for catholyte and another for anolyte.

Referring now to FIG. 1, a cross-sectional view of an anode chamber 62A in accordance with one embodiment of this invention is depicted. As depicted, chamber 62A includes a jet 100 passing through the center. Jet 100 typically includes a tube formed of an electrically insulating material. Anode chamber 62A comprises an anode cup 102, a contact 104, an ion source material 106 (phosphorized copper), and a membrane 108.

Anode cup 102 is typically an electrically insulating material such as polyvinyl chloride (PVC), polypropylene or polyvinylidene flouride (PVDF). Anode cup 102 comprises a disk shaped base section 116 having a central aperture 114 through which jet 100 passes. An O-ring 310 forms the seal between jet 100 and base section 116 of anode cup 102. Anode cup 102 further comprises a cylindrical wall section 118 integrally attached at one end (the bottom) to base section 116.

Contact 104 is typically an electrically conductive relatively inert material such as titanium. Further, contact 104 can be fashioned in a variety of forms; e.g. it can be a plate with raised perforations or, as illustrated in FIG. 1, a mesh. Contact 104 rests on base section 116 of anode cup 102. A positive output lead 112 from a power supply is formed of an electrically conductive relatively inert material such as titanium. Lead 112 is attached, typically bolted, to a rod 170 which is also formed of an electrically conductive relatively inert material such as titanium. Rod 170 passes through anode cup 102 to make the electrical connection with contact 104.

Resting on and electrically connected with contact 104 is ion source material 106, a form of phorphorized copper. In the depicted embodiment, ion source material 106 comprises a plurality of copper balls. The copper can be fashioned in a variety of shapes such as in a spherical, nugget, flake, concentric rings, or pelletized shape. In one embodiment, copper balls having a diameter in the range of 1 centimeter to 3 centimeters are used. Alternatively, ion source material 106 comprises a single integral piece such as a solid disk of material. During use, ion source material 106 electrochemically dissolves replenishing the ion concentration of the plating solution.

Ion source material 106 is contained in an enclosure formed by anode cup 102, membrane 108 and jet 100. More particularly, membrane 108 is attached to a seal ring 312 at a central aperture 107 of membrane 108 and to a seal ring 314 at its outer circumference. Seal rings 312 and 314 are formed of materials similar to those discussed above for anode cup 102. Seal ring 312 forms a seal with jet 100 by an O-ring 316 and seal ring 314 forms a seal with a second end (the top) of wall section 118 of anode cup 102 by an O-ring 318. By attaching membrane 108 to seal rings 312, 314, membrane 108 forms a seal at its outer circumference with the top of wall section 118 of anode cup 102 and also forms a seal with jet 100 at central aperture 107 of membrane 108.

Membrane 108 has a porosity sufficient to allow ions from ion source material 106, and hence electrical current, to flow through membrane 108. Although allowing electrical current to flow through, membrane 108 has a high electrical resistance which produces a voltage drop across membrane 108 from lower surface 109 to upper surface 111. This advantageously minimizes variations in the electric field from ion source material 106 as it dissolves and changes shape.

In addition to having a porosity sufficient to allow electrical current to flow through, membrane 108 also has a porosity sufficient to allow plating solution to flow through membrane 108, i.e. has a porosity sufficient to allow liquid (or at least ions) to pass through membrane 108. However, to prevent particulates generated by ion source material 106 from passing through membrane 108 and contaminating the wafer, the porosity of membrane 108 prevents particulates from passing through membrane 108. Generally, it is desirable to prevent particulates greater in size than about 0.1 micrometer in diameter from passing through membrane 108 and in one embodiment particulates greater in size than about 0.06 micrometer in diameter are prevented from passing through membrane 108.

In the depicted embodiment, the flow of plating solution into anode cup 102 is provided at several locations. Jet 100 is fitted with a plating solution inlet 120 located between membrane 108 and base section 116. A portion of the plating solution flowing through jet 100 is diverted through inlet 120 and into anode cup 102. To prevent inadvertent backflow of plating solution and particulates from anode cup 102 into jet 100, inlet 120 is sometimes fitted with a check valve which allows the plating solution only to flow from jet 100 to anode cup 102 and not vice versa.

In the specific embodiment depicted here, jet 100 is also provided with a plating solution outlet 124, which is connected by a tube 130 to an inlet 128 on base section 116 of anode cup 102. In this manner, a portion of the plating solution from jet 100 is directed into the bottom of anode cup 102. Outlet 124 is fitted with a check valve to prevent backflow of plating solution and particulates from anode cup 102 into jet 100.

Jet 100 is also provided with an outlet 132 connected by a tube 134 to an inlet 136 on wall section 118 of anode cup 102. In this manner, a portion of the plating solution from jet 100 is directed into the side of anode cup 102. Outlet 132 is fitted with a check valve to prevent backflow of plating solution and particulates from anode cup 102 into jet 100.

Although inlets 128, 136 on anode cup 102 are connected to outlets 124, 132 on jet 100, respectively, in other embodiments (not shown), inlets 128, 136 are connected to an alternative source of plating solution. For example, inlets 128, 136 are connected to a pump which pumps plating solution to inlets 128, 136 through tubing. Further, although plating solution is provided to anode cup 102 from inlets 120, 128, 136, in other embodiments (not shown), only one or more of inlets 120, 128 and 136 are provided. For example, solution flow is directed into anode cup 102 through inlet 120 only and inlets 128, 136 (and corresponding outlets 124, 132, check valves and tubes 130, 134, respectively) are not provided. Alternatively, a plurality of inlets 120, 128, 136 can be provided.

Referring still to FIG. 1, the plating solution introduced into anode cup 102 then flows out of anode cup 102 via two routes. First, some of the plating solution flows through membrane 108 and into plating bath 42A. As discussed above, the porosity of membrane 108 allows plating solution to pass through yet prevents particulates over a certain size from passing through. Thus, contaminant particulates generated as ion source material 106 dissolves do not pass through membrane 108 and into plating bath 42A and accordingly do not contaminate the wafer being electroplated. This is in contrast to conventional anode bags, which can allow particulates as large as 1.0 micrometers in diameter to pass through.

In addition to flowing through membrane 108, plating solution exits through outlets 140, 142 of anode cup 102. From outlets 140, 142, the plating solution flows through tubes 144, 146, though outlets 148, 150 of plating bath 42A and into overflow reservoir 56A. Check valves (not shown) can be provided to prevent backflow of plating solution from overflow reservoir 56A to anode cup 102. From overflow reservoir 56A, the plating solution is filtered to remove particulates including contaminant particulates and then returned to plating bath 42A and jet 100.

Preferably, plating solution removed from anode cup 102 through outlets 140, 142 does not directly enter plating bath 42A without first being filtered to remove contaminant particulates. Thus, outlets 140, 142 support a sufficient flow of plating solution through anode cup 102 to prevent anode passivation to the extent that membrane 108 does not.

Further, by locating outlets 140, 142 at the second end (top) of wall section 118 of anode cup 102, gas bubbles entrapped inside of anode cup 102, and more particularly, gas bubbles entrapped under membrane 108 are readily removed to overflow reservoir 56A. Gas bubbles can be a further source of defects on the plated surface.

Gas bubble removal is further enhanced by shaping membrane 108 as a frustum of an inverted right circular cone having a base at wall section 118 and an apex at jet 100. More particularly, by having the distance A between membrane 108 and base section 116 at wall section 118 greater than the distance B between membrane 108 and base section 116 at jet 100, gas bubbles entrapped under membrane 108 tend to move across membrane 108 from jet 100 to wall section 118. At wall section 118, these gas bubbles become entrained with the plating solution flowing through outlets 140, 142 and are removed into overflow reservoir 56A. Advantageously, these gas bubbles do not enter plating bath 42A and travel to the wafer and accordingly do not create nonuniformity in the deposited electrically conductive layer on the wafer.

In a specific embodiment, the flow system can provide electrolyte flow through the anode chamber at a flow rate of between about 100 and 2000 milliliters per minute. Further, the apparatus may provide electrolyte flow between the anode and cathode chambers at a rate of between 100 milliliters per minute and 1 liter per minute when the flow rate in the flow system is about 2000 milliliters per minute. Obviously, these values scale with the size of the apparatus.

It is sometimes desirable to have separate anolyte and catholyte chemistries. FIG. 2 provides a general block diagram of an electroplating system 201 having separate reservoirs for anolyte and catholyte in accordance with one preferred embodiment of this invention. An electroplating compartment 203 includes an anode chamber 205 and a cathode chamber 207. The anode chamber 205 is defined by a chemical transport membrane 209 enclosing an anode 211.

Anode chamber 205 includes an anolyte solution associated with the anode. Cathode chamber 207 forms, in this embodiment, the major chamber of electroplating compartment 203. It contains a "plating bath" associated with a cathode 213. Thus, the plating bath serves as a catholyte. Typically, cathode 213 is a semiconductor wafer having trenches etched on its surface for Damascene processing. During electroplating, the electrical field established between anode 211 and cathode 213 drives positive ions from anode chamber 205 through barrier 209 and cathode chamber 207 and onto cathode 213. At cathode 213, an electrochemical reaction takes place in which positive metal ions are reduced to form a solid layer of metal on the surface of cathode 213. In many designs, the cathode/substrate rotates during electroplating.

An anodic potential is applied to anode 211 via an anode electrical connection 215. Cathodic potentials are provided to cathode 213 via a lead 217, which may be made from a suitable metal such as titanium or tantalum.

The catholyte may be circulated between cathode chamber 207 and a catholyte reservoir 219. The temperature and composition of the catholyte may be controlled within catholyte reservoir 219. For example, one can monitor and control the level of non-ionic plating additives within reservoir 219. Gravity can enable the return of excess catholyte out of cathode chamber 207 and into catholyte reservoir 219. Treated catholyte from reservoir 219 may then be directed back into cathode chamber 207 by a pump 21 via a line 223.

In integrated circuit fabrication, plating operations may be performed in parallel on multiple wafers using multiple electrofill modules as described in U.S. patent application Ser. No. 09/706,272, by Mayer et al., filed Nov. 3, 2000, and previously incorporated by reference. In such cases, a central plating bath reservoir may supply multiple electroplating compartments. Thus, catholyte reservoir 219 may supply catholyte to multiple plating cells. In a specific example, anode chamber 205 has a volume of about 3 liters, cathode chamber 207 has a volume of about 15 liters, and catholyte reservoir 219 has a volume of about 150 liters, enough to supply multiple plating cells.

The anolyte in anode chamber 205 may be stored in and replenished from an anolyte reservoir 225. In this example, the anolyte system (compartment 205, reservoir 225 and the connecting plumbing) is an "open loop" system because the anolyte volume within the system can change; specifically, the anolyte volume in reservoir 225 can change. Examples of closed loop systems will be described below.

A pump 227 draws the anolyte from reservoir 225 into anode chamber 205. In some embodiments, flow is directed over the anode surface to facilitate mixing. Anolyte from chamber 205 may be recycled back to reservoir 225 via a line 229. The temperature and composition of the anolyte may be controlled within reservoir 225. In a specific embodiment, the concentration of copper ions in chamber 205 may be limited so that it does not reach saturation. When copper ions are produced at the anode and when hydrogen ions are used to carry substantial current across the porous membrane (as a supporting electrolyte), the concentration of copper ions within the anode chamber can increase to a high level and cause precipitation. Thus, there may be a need to introduce fresh dilute solution from reservoir 225 into chamber 205.

Another preferred embodiment is depicted in FIG. 3. In this embodiment, a system 301 includes many components that are identical or very similar to counterpart components in the embodiment depicted in FIG. 2. In FIGS. 2 and 3, like reference numerals represent like components. The embodiment of FIG. 3 is specifically designed to address the potential problem of increasing copper ion concentration in anode chamber 205. In this embodiment, a concentrated copper ion solution from anode reservoir 225 is fed into cathode chamber 207 via a line 303. And diluted electrolyte solution with plating additives removed via a catholyte treatment apparatus 305 is provided to reservoir 225 via a line 309. This serves to reduce the concentration of copper ions within chamber 205 and increase the concentration of copper ions in the catholyte. When anolyte solution is transferred from anode reservoir 225 to cathode chamber 207, an increase in the catholyte volume occurs. One way to handle this issue is to simply dump the excess catholyte. Alternatively, the excess volume, which is to be removed from catholyte reservoir 219, may be recycled. In the depicted embodiment, the catholyte from reservoir 219 is treated to remove the organic additives as part of the recycling process.

In the embodiment depicted in FIG. 3, excess catholyte from reservoir 219 is directed into a catholyte treatment apparatus 305 through a flow line 307. In a preferred embodiment, catholyte treatment apparatus 305 employs activated carbon filtration and/or reverse osmosis apparatus to remove essentially all of the organic additives from the catholyte. Activated Carbon filters are widely used. One suitable filter is the Model CBC-20 available from U.S. Filters Corporation, Plymouth Products division of Sheboygan, Wis.

With the organic additives (including any breakdown products) removed from the catholyte bleed, the material can be recycled into the anode reservoir 225 via line 309. This greatly reduces waste generation while still maintaining high performance plating.

The Anode

The anode is typically composed of pure copper or copper alloy together with phosphorus. Key attributes for proper film formation include grain size, phosphorous content, distribution of phosphorus in the grains, and general copper purity. When chosen carefully, one or more of these attributes reduce generation of the sub-micron defects that have become apparent in copper electroplating of IC lines and interconnects.

Regarding the anode purity, preferably the copper is substantially free of oxygen and has low or very low concentrations of other impurities, except for phosphorus. At most it should have no more than about 30 ppm of any one of silver, nickel, iron, sulfur, tin, antimony, arsenic, lead, nickel, zinc or other impurities. Preferably, it should have no more than about 17 ppm of silver, 6.7 ppm of nickel, 5.4 ppm of iron, 1.1 ppm of tin, 0.9 ppm of antimony, 0.9 ppm of arsenic, 0.7 ppm of lead, 0.6 ppm of zinc and 0.5 ppm of other metals.

When phosphorus is present, it generates an adherent black film associated with copper dissolution during electroplating. In one preferred embodiment the anode contains at least about 200 ppm atomic phosphorus, more preferably between about 200 and 1000 ppm atomic phosphorus, and even more preferably between about 300 and 800 ppm. In an especially preferred embodiment, the concentration of phosphorus is between about 450 and 600 ppm as determined by GDMS.

As indicated, the grain size of the copper anode plays an important role in minimizing particle formation. For some embodiments (particularly those where the phosphorus is strongly segregated within the grains), relatively moderate grain sizes on the order of 1 to 300 micrometers may be employed. Generally, however, the anodes should have an average grain size of at least about 50 micrometers (principal dimension). More preferably, the average grain size should be between about 200 and 1000 micrometers. The use of very large grained anodes (on the order of about 1 to 50 millimeters) can be employed. With such large grained materials, it is not so important that the phosphorus be distributed at the grain boundaries.

It has been found that good performing anodes have phosphorus strongly segregated at the grain boundaries. In the case where phosphorus is distributed within the grains themselves, the anodes sometimes showed poor defect performance. Hence, in accordance with this invention, the phosphorus in the copper anode is preferably distributed unevenly throughout the grains—with the phosphorus having a higher concentration at the grain boundaries and a lower concentration in the grain interiors. It has been found that during normal dissolution of a metal, the attack is often fastest along grain boundaries. It is believed that the wafer defects associated with certain anodes result from partially dissolved grains that dislodge. These dislodged grains may subsequently either reach the wafer surface and directly impact local plating or deliver chemical to the wafer surface, which disrupts plating, or causes disruption of the black film on the anode and contamination of the bath with black film. By forming anodes of relatively large grain sizes and segregating phosphorus at the grain boundaries the defects are minimized, likely by preventing dissolution along the grain boundaries and release of partially dissolved grains. Alternatively, very large grains can impart a defect improvement simply because there are very few grain fragments available to dissolve owing the large grain size.

The anode structure may take many different forms. Preferably, it takes the form of a single integral piece such as a solid disk of material. Alternatively, it can take the form of rings, rods, spherical balls, nuggets, flakes or pellets. In a specific embodiment, copper balls having a diameter in the range of 1 to 3 centimeters are used. Any of these products may be rolled or cast.

Suitable copper anode materials can be obtained from Univertical Corporation of Detroit, Mich., U.S.A (e.g., 8 inch phosphorized copper anodes, 1 inch thick). These anodes have been found to have grains about 100 micrometers in diameter, with phosphorus in a concentration of between about 400 and 650 ppm—concentrated toward the grain boundaries.

Separator Function, Composition, Structure

As mentioned, the separator should permit passage of ionic current but strongly restrict passage of small particles generated at the phosphorized copper anode. The separator materials should also be chemically compatible with the plating bath during extended operation. Preferably, the separator material is porous and allows passage of both anions and cations. Examples of suitable separator materials include porous glasses (e.g., glass frits made by sintering fine glass powder), porous ceramics (e.g., alumina and zirconia), silica areogel, organic aerogels (e.g. resorcinol formaldehyde areogel), porous polymeric materials, and filter membranes. Suitable porous ceramics, such as grade P-6-C can be obtained from Coorstek of Golden, Co. Suitable examples of polymeric membrane include: napped polypropylene available from Anode Products, Inc. located in Ill.; spunbond snowpro polypropylene and various polyethylene, RYTON, and TEFLON materials in felt, monofilament, filament and spun forms available from various suppliers including Snow Filtration, 6386 Gano Rd., West Chester, Ohio.

For many suitable separator materials, the thickness, porosity, pore size, etc. can be adjusted to increase ionic conductance and effectively filter small particles generated at the phosphorized copper anode. Generally, reducing the thickness and increasing porosity will increase the ionic conductance, and generally increase the flow rate through the separator. As an example, the thickness may be on the order of 0.1 to 3 centimeters, the porosity between about 25 and 85% void, and the average pore size may be small; e.g., at most about 0.05 micrometers. Generally, the pore size should be about the same as the minimum particle size that will pass through the membrane, preferably between about 0.05 and 0.1 micrometers.

In a specific embodiment, the porous membrane is a porous plastic such as Kynar, sintered polyethylene or polypropylene. This material is preferred because of its compatibility in construction with other plastic components. Preferably, the material has a porosity (void fraction) of about 25 to 85% by volume, with the average pore size ranging between about 0.5 and 20 micrometers. Further, the material has a thickness of between about 0.15 to 3 centimeters. Certain suitable porous plastics falling within this embodiment can be obtained from Portex Corporation of Fairburn, Georgia. In one example, the sintered polyethylene or polypropylene is the "ultrafine" grade of porous sheet produced by Portex Corporation.

In an especially preferred embodiment, the porous membrane is made from three separate layers of material: a thin small pore size material sandwiched between two thicker larger pore size sheets. In a specific embodiment, the thin small pore size material is a sheet of porous polyolefin (e.g., polyproplyene) having a thickness of approximately 10–50 micrometers (e.g., 25 micrometers) and an average pore size of less than about 0.5 micrometers (typically approximately 0.01 to 0.2 micrometers (e.g., 0.05 micrometers)). The first layer is a thin (typically 0.001 in thick) sheet of polymer with very small (<0.5 um). One suitable product is Celgard 2400 made by Celgard Corporation, a division of Hoechst, of Charlotte, N.C. The middle layer provides a large resistance to flow but allows good ionic conductivity. The outer two layers provide mechanical strength and extra resistance to flow, and a stagnant region where primarily only diffusion of non-ionic species can occur. In a preferred embodiment, these are sheets of sintered polyolefin having a thickness of between about ⅛ and ½ inches and an average pore size of approximately 5 to 20 micrometers (e.g., 10 micrometers). One example of a suitable material for the outer two layers is the "Ultrafine" grade sintered polyethylene sheet available from Portex Corporation. This three-layer design has been found to prevent substantially all anode particles from passing from the anode chamber to the main reservoir.

In general, a purpose of this three-layer construction is to achieve a membrane which allows both anions and cations to move freely through the membrane and have properties of minimal added resistance to electrical flow, but substantial resistance to fluid flow. The thin porous inner sheet creates a substantial resistance to fluid flow (due to the very small pores) and minimal resistance to current flow (due to its thinness). However, diffusion across this inner membrane would be great if used by itself (because of the small distance across the membrane). Also the membrane is flexible and weak and must be supported. The membrane is therefore affixed to two sintered porous polypropylene or polyethylene sheets of about ⅛" thick each. This sandwich has substantial mechanical strength allowing easy fabrication into a membrane housing. The sintered porous sheet creates a substantially thick region where little or no fluid movement occurs (because the pores are on the ~7 micrometer scale and because there is a thin sheet of separator material below them which substantially allows no flow to pass through it).

In some embodiments, it may be advantageous to use an activated carbon "filter" material placed between the anode and the separator, most preferably touching or in very close proximity to the separator. When some organic material happens to pass through the separator, it is absorbed into the carbon filter. In this way the rate of diffusion to the anode is reduced by 1) diffusion restriction via the separator and 2) absorption into an activated carbon filter. Also, any detrimental decomposition products formed at the anode can be absorbed in the filter prior to passing back into the cathode chamber. The activated carbon filter can be of a number of designs such as carbon fiber cloth, activated carbon impregnated microporous polyproplyene, carbon aerogel sheets, and the like.

Catholyte and Anolyte

The anolyte and catholyte may have the same composition or different compositions. Generally, the catholyte should promote good bottom-up electroplating on a silicon substrate. It should have good ionic conductivity, adequate metal ion concentration to ensure that metal deposition will not be concentration limited, and additives to promote bottom-up plating. The catholyte should be optimized for film quality, uniformity of deposition, and fill performance.

The components of a suitable catholyte generally include copper (or other deposition metal) ions, a supporting electrolyte such as acid (if necessary to improve conductivity), and "plating additives." Examples of plating additives include accelerators, suppressors, and levelers.

Suppressors generally provide a large change in the kinetic overpotential of the deposition reaction. This tends to give a more uniform current distribution over the surface of the wafer and thereby allows the copper deposition to proceed with a global leveling. The suppressors absorb strongly to copper and are not substantially consumed during the deposition reaction. Suppressors should be distinguished from levelers, which also increase the surface overpotential but which are consumed or altered during the deposition reaction. Typically suppressors are high molecular weight oxygen containing polymers such as polyethylene oxide, polypropylene oxide, co-polymers (random and block) of the monomers of the preceding polymers, and other strong surfactant molecules. Preferably, polymeric suppressors that may be used with this invention have a molecular weight of between about 1000 and 10,000 with concentrations of about 100–1000 parts per million by weight.

Accelerators (also referred to as catalysts or brighteners) are also strongly surface adsorbing and they compete with the suppressor molecules for surface sites on the deposited copper. The accelerators can alter the suppression process and tend to relatively accelerate the local plating process on the active surface of the copper seed layer. Often, accelerators are sulfur containing, low molecular weight compounds such as mercaptopropane sulfonic acid (MPS), N—N-methyl dithiocarbonic acid (DPS), and dimercaptopropane sulfonic acid (SPS). Preferably a combination of accelerators and suppressors is used to obtain void free filling of high aspect ratio vias and trenches. Preferably, the accelerators that may be used with this invention are present in a concentrations of between about 0.5 and 25 parts per million by weight. Examples of other "additives" include surface agent such as wetting agent. Examples of wetting agents include sodium lauryl sulfate (e.g., between about 0–2% by weight), and various co-polymers of ethylene oxide (EO) and proplyene oxide (PEO).

Examples of suitable copper salts include copper sulfate, copper phosphate, copper pyrophosphate, copper perchlorate and copper salts of any other stable anion over the potential likely to be found in the copper plating operation. These are preferably present in the catholyte at a concentration of between about 10 and 50 grams of copper ion per liter of electrolyte, more preferably between about 18 and 40 grams of copper ion per liter. Typically, higher copper concentrations are used in combination with lower acid concentrations. Examples of supporting electrolyte include sulfuric acid, phosphoric acid, hydrochloric acid, and the like. A typical sulfuric acid supporting electrolyte is preferably present in the catholyte at a concentration of between about 0 and 250 gm/l weight percent, more preferably between about 10 and 180 weight percent.

Various commercially available copper plating baths are suitable for many embodiments of this invention. Examples of commercial copper plating solutions suitable for use with this invention include Ultrafill™ available from Shipley Ronal of Marlboro, Mass. and CuBath™ and Viaform™ available from Enthone OMI of New Haven, Conn. Both of these solutions contain non-ionic organic additives that facilitate bottom-up plating.

The anolyte contained in the anode chamber generally will have a composition similar to that of the catholyte but, in some embodiments, may be substantially free of non-ionic plating additives. Or the anolyte may contain such additives, but at a greatly reduced concentration. For example, to the extent that organic additives are present in the anolyte, they may be maintained at concentrations below about 10% of that in the catholyte. When practical, it is also generally preferable that the anolyte contain a substantially lower acid concentration than the catholyte.

In one embodiment, the anolyte includes one or more copper salts (e.g., copper sulfate) dissolved in water. It is substantially devoid of organic species, particularly accelerators. The electrolyte also can contain an acid. Typical formulations for the anolyte have between about 10 and 50 gm/l copper (as $Cu^{+2}$), and between about 0 and 200 gm/l $H_2SO_4$. More preferably, the anolyte concentration of copper is between about 15 and 40 gm/l and the concentration of acid is between about 0 and 180 gmA $H_2SO_4$. Examples of two preferred formulations of electrolyte are (1) about 40 gmA $Cu^{+2}$ and at most about 10 g/L $H_2SO_4$ (referred to as a low acid formulation) and (2) about 18 g/L Cu+2 and about 180 g/L $H_2SO_4$ (referred to as a high acid formulation). Generally, the catholyte contains a substantially greater concentration of the non-ionic organic plating additives than the anolyte.

EXAMPLES

Figure 4:
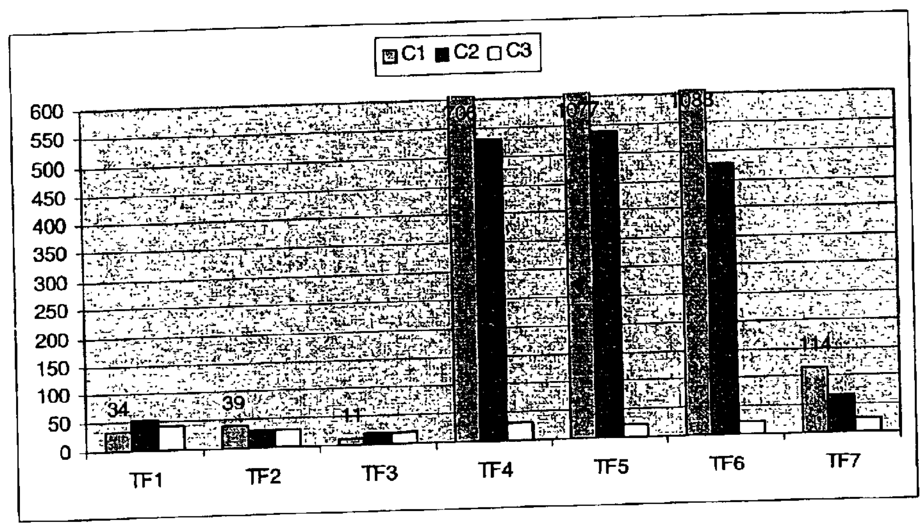
FIG. 4 is a bar graph showing defect levels on the wafer surface as a function of current density and filtration.
Figure 5:
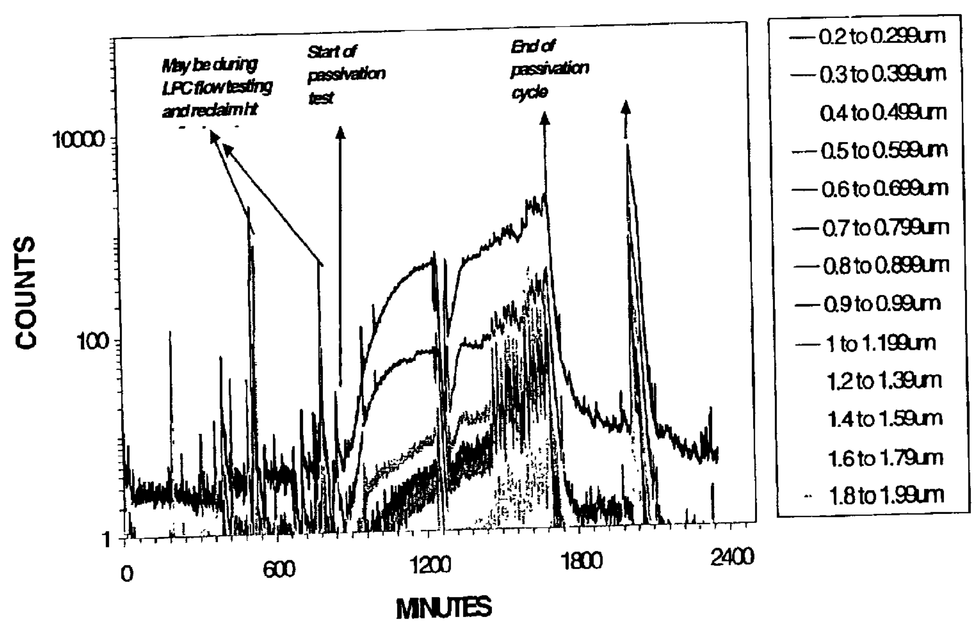
FIG. 5 is a graph showing particle counts near the wafer surface during the plating process using MRC anodes and standard anode chambers with diffuser plates.

FIG. 4 shows defect levels on wafer surfaces in each of 3 plating cells over a period of time. The third cell (C3) was not used for cycling plating but was used for test wafers. The third cell was continuously supplied with plating solution using the same reservoir as the first two cells but the solution was filtered prior to reaching the third cell using a 0.05 micron filter (nominal filter rating). The electrolyte composition was 175 grams per liter of acid, 17.5 grams per liter of copper, 50 ppm chlorine and various organic constituents. The anode was 8 inch to 1 inch phosphorized copper obtained from MRC Corporation. Initial tests (TF1, TF2, TF3) were carried out cycling wafers at a low current density (about 25 milliamps per square centimeter) to form 1.0 micrometers of deposited copper. Prior to each of the TF1, TF2 and TF3 tests, 50 wafers were processed through the tool. Defects remained low both in the cells where plating was taking place and in the third cell. Film generation rates were not adequate to result in particle formation in solution and transport to the wafer surface. Starting with TF4 through TF6, a higher plating current (about 50 milliamps per square centimeter) was used and film generation rates increase in proportion to the higher net currents. Prior to each of TF4, TF5 and TF6 the equivalent of 850 wafers were processed though the tool. Defects also increased quickly in these cells indicating transport of dislodged film to the wafer surface. Defects remained low in the third cell where filtering was used. This data shows that the defect issue is associated with the individual plating cells in which plating is taking place. It also shows that when filtered, the bath from these cells can be used in a third cell without causing defects. Between TF6 and TF7 flow in the tool continued but no wafers were plated for 8 hours. The defect results for TF7 show that defects will diminish in the cells in which plating has taken place if flow through these cells continues. FIG. 5 shows particle counts near the wafer surface during the plating process using MRC anodes and standard anode chambers with diffuser plates. Initially the particle count is quite low while plating at a low current, but as plating continues at a higher current the particle counts increase sharply. This particle count increase apparently correlates to the increase in defects which is observed under the high current/rapid film formation conditions. Likewise, when current flow is stopped (end of passivation test) the particle counts drop and fewer defects will be expected. This data taken together indicate that particle generation at, and release from, the anode is correlated with defect formation at the wafer.

Table 1 shows defects as a function of duration of anode use using anodes supplied by MRC and by Univertical. These tests are performed using an anode chamber with a diffuser plate. It shows that defects begin to increase after a period of time using the MRC anodes but do not increase when the Univertical anode is used. This result is reproducible using numerous anodes and plating cells and indicates an increase in film stability associated with the structure of the Univertical anode.

The differing behavior of the MRC and Univertical anodes demonstrates the importance of anode composition on the nature and stability of the anode film which forms during anode dissolution. The films from the Univertical anodes do not readily dislodge in a form which can be transported to the wafer surface and cause defects.

TABLE 1

| TEST | ANODE | Defects after 3 hours | Defects after 6 hours | Defects after 9 hours | Defects After 12 hours |
|---|---|---|---|---|---|
| #1 | Anode 1 MRC | 30 | 278 | 249 | 285 |
| | Anode 2 UV | 18 | 9 | 13 | 15 |
| | Anode 3 MRC | — | 125 | — | — |
| #2 | Anode 4 UV | 11 | 44 | 79 | 10 |
| | Anode 5 UV | 6 | 5 | 8 | 11 |
| | Anode 6 MRC | 275 | 260 | 585 | 600 |

Table 2 shows defect results on wafer surfaces during high current cycling using MRC anodes when the flow pathway which exits from the anode chamber and returns to the main plating bath reservoir is varied. A standard napped polypropylene diffuser membrane and a porous polypropylene sheet membrane are used between the wafer and the anode. A low exit flow will force most solution which enters the anode chamber (to prevent passivation) to pass through the anode membrane and toward the wafer surface. A high exit flow will result in more flow into the chamber being returned to the plating bath reservoir. Defects on the wafer surface are seen to be lowest when more solution is returned to the reservoir where it can be filtered prior to re-use. The results specifically demonstrate that the flow pathway of the bath used to prevent anode passivation is capable of modulating on-wafer defects. To prevent defects, solution laden with particulates after passing by the anode can be returned to the reservoir for sub-micron filtration.

TABLE 2

| TEST | Exit Flow | Defects after 3 hours | Defects after 6 hours | Defects after 9 hours | Defects After 12 hours |
|---|---|---|---|---|---|
| #1 | High | — | 500 | | |
| | Medium | — | 1750 | | |
| | Low | — | 2200 | | |

Table 3 shows defect results on wafer surfaces using three types of membrane separators between the MRC anode and the wafer surface. The types of membrane systems used are designated as POR, DM, and SAC. POR uses a standard napped polypropylene membrane and a porous solid polypropylene membrane between the anode and the wafer. SAC uses a highly restrictive sub micron filter sandwiched between porous polypropylene filters, and a single porous solid polypropylene membrane between the anode and the wafer. DM uses two porous solid polypropylene membranes between the anode and the wafer. Somewhat lower defects are observed in the case of DM compared to POR indicating a reduction in particle transport to the wafer surface. SAC results could not be obtained because the anode Passivated. This result reflects the reduction of flow into and out of the anode chamber and resultant build-up of film and copper sulfate crystals on the wafer but does not indicate that SAC membrane would give a poor defect result if passivation were prevented by allowing for higher flow into the anode chamber and out of the chamber through a path leading directly to the main bath reservoir.

TABLE 3

| TEST | Membrane | Defects after 3 hours | Defects after 6 hours | Defects after 9 hours | Defects After 12 hours |
|---|---|---|---|---|---|
| 1 | POR | — | 194 | — | — |
| | SAC | — | Passivated | — | — |
| | DM | — | 101 | | |

Table 4 shows defect results during high current cycling using MRC anodes using POR and DM condition as in the case of Table 3, and using the SAC membrane when the flow into the anode chamber using the SAC membrane is increased. Using the SAC membrane the flow into the anode chamber can either pass through a sub micron filter and proceed toward the wafer surface or it can return directly to the bath reservoir in which case it will be filtered using 0.05 or smaller filters before re-use. Again, defects are highest in the case of the POR membrane indicating the largest particulate transport to the wafer surface. Defects are again reduced using the somewhat more particle and flow restrictive DM membrane system. Defects are nearly eliminated in the case of the SAC membrane. Specifically, a solution to the defects cause by phosphorized anode particulates is recognized when the solution flow to the vicinity of the anode is maintained at a sufficiently high level to prevent anode passivation but this flow is restricted from delivering particles to the wafer surface by either being returned in desired proportions to a reservoir for further filtration or transported th rough a sub 1.0 micron membrane to the wafer surface to provide for agitation during plating.

TABLE 4

| TEST | Membrane + Exit Flow | Defects after 3 hours | Defects after 6 hours | Defects after 9 hours | Defects After 12 hours |
|---|---|---|---|---|---|
| #1 | POR + Low | — | 974 | | |
| | SAC + High | — | 19 | | |
| | DM + Low | — | 101 | | |

Other Embodiments

While this invention has been described in terms of a few preferred embodiments, it should not be limited to the specifics presented above. Many variations on the above-described preferred embodiments may be employed. Therefore, the invention should be broadly interpreted with reference to the following claims. For example, this invention has been described in the context of electroplating a metal onto a semiconductor substrate. The invention is not limited to semiconductor substrates. Various other substrates can be electroplated using this invention. Examples of other substrates include printed circuit boards, "packaging" for integrated circuits, and the like.

What is claimed is:

1. An apparatus for electroplating copper on a substrate, the apparatus comprising (a) a cathode electrical connection that can connect to the substrate and apply a potential allowing the substrate to become a cathode;

(b) a copper anode having an average grain size of at least about 50 micrometers and comprising phosphorus in a concentration of at least about 200 ppm; and (c) a membrane separator defining an anode chamber, which membrane separator enables migration of ionic species, including metal ions, across the membrane separator while substantially preventing particles larger than about 0.05 micrometers from passing.

2. The apparatus of claim 1, wherein the membrane separator has an average pore size of at most about 0.05 to 0.1 micrometers.

3. The apparatus of claim 1, wherein the average grain size of the copper anode is at least about 200 micrometers.

4. The apparatus of claim 3, wherein the average grain size of the copper anode is between about 200 and about 1000 micrometers.

5. The apparatus of claim 4, wherein the average grain size is between about 500 and about 1000 micrometers.

6. The apparatus of claim 1, wherein the phosphorous is present in the copper anode in a concentration of at least about 400 ppm.

7. The apparatus of claim 1, wherein the phosphorous is present in the copper anode in a concentration of between about 200 and about 1000 ppm.

8. The apparatus of claim 7, wherein the phosphorous is present in the copper anode in a concentration of between about 450 and about 600 ppm.

9. The apparatus of claim 1, further comprising a reservoir for electrolyte and a flow system, coupled to said reservoir, for circulating electrolyte through the anode chamber during electroplating.

10. The apparatus of claim 9, further comprising a filter in the flow system for filtering particles from the electrolyte.

11. The apparatus of claim 9, wherein the flow system can provide electrolyte flow through the anode chamber at a flow rate of between about 100 and 2000 milliliters per minute.

12. The apparatus of claim 11, wherein the membrane separator permits a flow rate of between about 100 milliliters per minute and 1 liter per minute when the flow rate in the flow system is about 2000 milliliters per minute.

13. A method of electroplating copper onto a substrate, the method comprising:

(a) providing a copper anode in an anode chamber separated from a cathode chamber by a membrane separator that enables migration of ionic species, including ions of the metal, across the membrane while substantially preventing particles larger than about 0.05 micrometers from passing; and (b) applying a potential difference between the substrate and the anode to allow the substrate to become a cathode and plate the copper onto the substrate, wherein the copper anode has an average grain size of at least about 50 micrometers and comprises phosphorus in a concentration of at least about 200 ppm.

14. The method of claim 13, wherein the membrane separator has an average pore size of at most about 0.05 micrometers.

15. The method of claim 13, wherein the average grain size of the copper anode is at least about 200 micrometers.

16. The method of claim 15, wherein the average grain size of the copper anode is between about 200 and 1000 micrometers.

17. The method of claim 16, wherein the average grain size of the copper anode is between about 500 and 1000 micrometers.

18. The method of claim 13, wherein the phosphorous content of the copper anode is at least about 400 ppm.

19. The method of claim 13, wherein the phosphorous content of the copper anode is between about 200 and 1000 ppm.

20. The method of claim 19, wherein the phosphorous content in the copper anode is between about 450 and 600 ppm.

21. The method of claim 13, wherein the phosphorous in the copper anode is preferentially distributed toward the grain boundaries of copper grains within the copper anode.

22. The method of claim 13, further comprising flowing electrolyte from a reservoir through the anode chamber during electroplating.

23. The method of claim 22, further comprising filtering the electrolyte prior to flowing it through the anode chamber.

24. The method of claim 23, wherein the electrolyte is flowed through the anode chamber at a rate of between about 100 and 2000 milliliters per minute.

25. The method of claim 24, wherein the electrolyte flows through the membrane separator, from the anode chamber to the cathode chamber, at a rate of between about 100 milliliters per minute and 1 liter per minute.

* * * * *